United States Patent
Lu et al.

(10) Patent No.: US 7,262,129 B2
(45) Date of Patent: Aug. 28, 2007

(54) MINIMIZING RESIST POISONING IN THE MANUFACTURE OF SEMICONDUCTOR DEVICES

(75) Inventors: Zhijian Lu, Plano, TX (US); Thomas M. Wolf, Allen, TX (US); Scott W. Jessen, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 355 days.

(21) Appl. No.: 10/993,791

(22) Filed: Nov. 19, 2004

(65) Prior Publication Data

US 2006/0110901 A1    May 25, 2006

(51) Int. Cl.
*H01L 21/4763* (2006.01)

(52) U.S. Cl. ............... 438/638; 438/637; 438/672; 257/E21.577; 257/E21.027

(58) Field of Classification Search ............... 438/637, 438/638, 672
See application file for complete search history.

(56) References Cited

U.S. PATENT DOCUMENTS

| | | | |
|---|---|---|---|
| 6,013,579 A | 1/2000 | Wang et al. | |
| 6,103,456 A | 8/2000 | Többen et al. | |
| 6,488,509 B1 * | 12/2002 | Ho et al. | ............ 438/629 |
| 6,489,238 B1 | 12/2002 | Tsui | |
| 6,534,397 B1 | 3/2003 | Okada et al. | |
| 6,586,339 B1 | 7/2003 | Plat et al. | |
| 6,605,536 B2 | 8/2003 | Eissa et al. | |

* cited by examiner

*Primary Examiner*—Alexander Ghyka
(74) *Attorney, Agent, or Firm*—Peter K. McLarty; W. James Brady, III; Frederick J. Telecky, Jr.

(57) ABSTRACT

The present invention provides a method for manufacturing an interconnect and a method for manufacturing an integrated circuit including the interconnect. The method of manufacturing an interconnect, among other steps, includes forming a via (160) in a substrate (130) and then forming a base getter material (210) in the via (160). The method further includes forming a photoresist layer (410) over the base getter material (210), the photoresist layer (410) having an opening (420) therein positioned over the via (160), and etching a trench (510) into the substrate (130) using the opening (420) in the photoresist layer (410).

8 Claims, 4 Drawing Sheets

MINIMIZING RESIST POISONING IN THE MANUFACTURE OF SEMICONDUCTOR DEVICES

TECHNICAL FIELD OF THE INVENTION

The present invention is directed, in general, to the manufacture of semiconductor devices, and in particular, the manufacture of semiconductor devices using resists.

BACKGROUND OF THE INVENTION

There is great interest in the introduction of low-k dielectric materials into semiconductor devices. The use of insulating layers made of low-k dielectrics is expected to decrease the interconnect delay time, also called the RC delay, as semiconductor device geometries continue to shrink. Employing low-k dielectrics having suitable adhesion to the underlying conductive (e.g., copper) structures, however, has been problematic.

To reduce or alleviate the low-k dielectric adhesion problems, the industry places an adhesion layer, such as a silicon carbide nitride layer between the low-k dielectric layer and the underlying conductive structures. While the silicon carbide nitride adhesion layer helps, it does not completely eliminate all adhesion issues. For this reason, the industry treats the upper surface of the conductive structures with ammonia prior to forming the silicon carbide nitride adhesion layer. Fortunately, the ammonia treatment substantially eliminates the adhesion issues.

While the ammonia treatment substantially eliminates the adhesion issues, it introduces resist poisoning issues into the manufacturing process. Resist poisoning refers to the movement of contaminating materials present in various layers of the device into the resist. The resist is considered poisoned because the contaminating materials alter the reactive properties of the resist. In the instance of the ammonia treatment, the basic ammonia neutralizes the acids required to pattern the resist. Resist poisoning, in turn, can cause non-uniformities in the pattern, resulting in an imperfect transfer of the intended pattern into the substrate. This, in turn, limits the spatial resolution of device circuit features that can be achieved without a substantial increase in device defects.

In addition to the ammonia treatment of the upper surface of the conductive structures causing resist poisoning, the deposition process used to form a via etch stop layer located on the conductive structures also introduces resist poisoning problems. For example, many via etch stop layers contain nitrogen, the nitrogen typically being introduced with ammonia. Unfortunately, the ammonia that remains within the via etch stop layers after their manufacture, causes similar resist poisoning issues as typically result from the ammonia treatment of the conductive structures.

Previous attempts to reduce resist poisoning, whether introduced by the ammonia treatment, via etch stop layer, or another process, are unsatisfactory. For instance, the introduction of a barrier layer into the device itself to prevent movement of the contaminating materials into the resist has had limited success. The introduction of the barrier layer increases the cost and complexity of device fabrication. In some instances, it is impractical to remove the barrier layer after the threat of resist poisoning has past. Moreover, the barrier layer can increase the capacitance of the device, thereby causing undesirable increases in the RC delay.

Accordingly, what is needed in the art is an improved method of manufacturing semiconductor devices that can benefit from the use of low-k dielectrics, while not suffering the deficiencies of previous approaches.

SUMMARY OF THE INVENTION

To address the above-discussed deficiencies of the prior art the present invention provides a method for manufacturing an interconnect and a method for manufacturing an integrated circuit including the interconnect. The method for manufacturing the interconnect, among other steps, includes forming a via in a substrate and then forming a base getter material in the via. The method further includes forming a photoresist layer over the base getter material, the photoresist layer having an opening therein positioned over the via, and etching a trench into the substrate using the opening in the photoresist layer.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGS. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based upon the discovery that the photoresist contamination caused by the ammonia pre-treatment of the upper surface of the copper conductive features and the formation of a via etch stop layer can be substantially avoided, or at least minimized, by forming a base getter material, preferably in the via portion of an interconnect, prior to formation of the photoresist layer that will ultimately be used to define the trench portion of the interconnect. Therefore, the base getter material, in one instance, plugs the via thereby preventing the ammonia or other known contaminant from substantially contacting the photoresist layer. In one circumstance, the base getter material includes an acid that substantially neutralizes the basic content of the contaminant, and thereby prevents the contaminants from substantially contacting the photoresist layer that way.

As a consequence of the inventive methodology, high-quality, multi-metallization level semiconductor IC devices can be readily and cost-effectively fabricated utilizing otherwise conventional processing methodologies and instrumentalities. Further, while the inventive methodology is especially suited for use in dual-damascene processing, the invention is applicable to all workpiece processing wherein patterned photoresist layers are employed for recess formation in a substrate.

Figure 1:
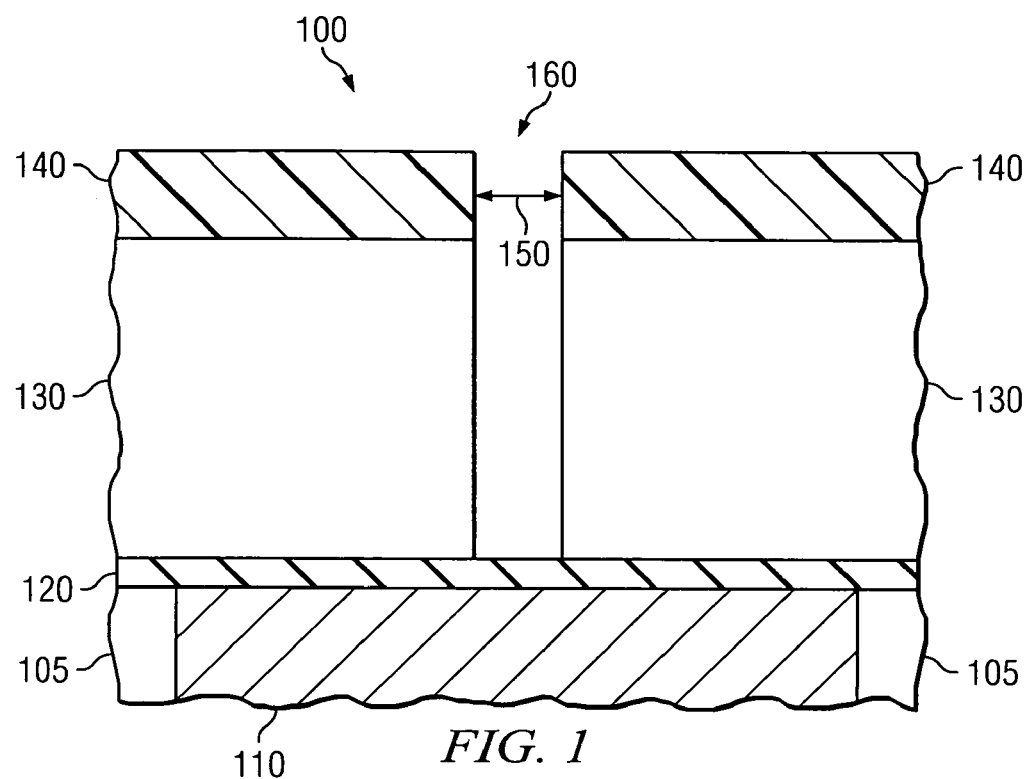
FIG. 1 illustrates a cross-sectional view of an interconnect structure at an initial stage of manufacture.

Referring now to FIGS. 1-6, shown therein are simplified, cross-sectional, schematic views illustrating a sequence of steps used in manufacturing an interconnect, such as a dual-damascene interconnect, according to the principles of the present invention. FIG. 1 illustrates a cross-sectional view of an interconnect structure 100 at an initial stage of manufacture. The interconnect structure 100 of FIG. 1 initially includes a lower metal feature 110, such as a copper (Cu) or Cu alloy-based contact or interconnect, routing, or bus line, in-laid in the upper surface of a first substrate 105.

The first substrate 105 may be any layer in an integrated circuit, however, in the particular embodiment illustrated in FIGS. 1-6 the first substrate 105 is an interlevel dielectric layer. While not shown, the first substrate 105 may overlie a semiconductor substrate (not shown in the FIGS. for illustrative simplicity), typically a doped monocrystalline silicon (Si) or gallium arsenide (GaAs) wafer including at least one active device region, e.g., a source or drain region of a transistor, formed therein or thereon.

Located over the lower metal feature 110 is an intermediate layer 120. The intermediate layer 120, which may comprise SiCN or another similar material, is advantageously placed upon the lower metal feature 110 as an adhesion layer between the lower metal feature 110 and a second substrate 130 for reliability reasons. In the illustrative embodiment shown in FIG. 1, the intermediate layer 120 also acts as a via stop layer. The intermediate layer 120 may be formed using a conventional process, including a conventional chemical vapor deposition (CVD) process, to a thickness ranging from about 20 nm to about 100 nm thick, preferably about 60 nm thick.

It should be noted that prior to the formation of the intermediate layer 120, the lower metal feature 110 may conventionally be subjected to ammonia, the ammonia altering the top surface of the lower metal feature 110 in such a way as to cause the intermediate layer 120 to adhere to the lower metal feature 110 better. It is believed that the ammonia treatment, along with the intermediate layer 120, provides a sufficient amount of adhesion between the lower metal feature 110 and the second substrate 130. Those skilled in the art also understand that the ammonia treatment may be foregone without departing from the scope of the present invention.

Formed over the intermediate layer 120 is the second substrate 130. The second substrate 130 in the embodiment shown and discussed with respect to FIGS. 1-6 is an interlevel dielectric layer. The second substrate 130 may comprise any dielectric material known by those skilled in the art, such as silicon dioxide, a low dielectric constant material, or a non-silicon dielectric material. The use of insulating materials having a low dielectric constant (low-k) are exemplary as they reduce the parasitic capacitance of the interconnect structure 100, thereby improving the operating speed of the devices it ultimately contacts. In an exemplary embodiment, the second substrate 130 comprises a low-k material, and has a thickness ranging from about 100 nm to about 1000 nm, and a preferred thickness of about 250 nm. Other thicknesses and materials may nonetheless be used. The second substrate 130, similar to the intermediate layer 120, may be formed using a number of different conventional processes.

Conventionally located over the second substrate 130 is a first photoresist layer 140. The first photoresist layer 140 may comprise any known or hereafter discovered photoresist material while staying within the scope of the present invention. In an exemplary embodiment of the invention, however, the first photoresist layer 140 comprises a methacrylate, such as a 193 nm resist polymer. The first photoresist layer 140 may also advantageously include a variety of different thicknesses. Accordingly, in one particular embodiment the first photoresist layer 140 has a thickness ranging from about 160 nm to about 350 nm.

As is illustrated in FIG. 1, the first photoresist layer 140 is patterned, as by conventional techniques not described herein for brevity, to include at least one opening 150 therein in vertical registry with the lower metal feature 110. The opening 150 has a relatively narrow width corresponding to the width of a via opening to be next formed in the second substrate 130. The width of the opening 150 is typically from about 90 nm to about 160 nm, and preferably about 100 nm wide. Other widths are nonetheless within the scope of the present invention.

The opening 150 in the first photoresist layer 140 is then used to form a via 160 in the second substrate 130. In the particular embodiment shown, the via 160 does not extend through the intermediate layer 120. Additional etch processes may be needed to etch through the intermediate layer 120 at a later stage of manufacture. Those skilled in the art understand the process for using a patterned photoresist layer to etch a via in a substrate. In one exemplary embodiment a reactive plasma etching process using $C_4F_8/O_2/Ar$ is used to etch through the second substrate 130 to form the via 160.

Figure 2:
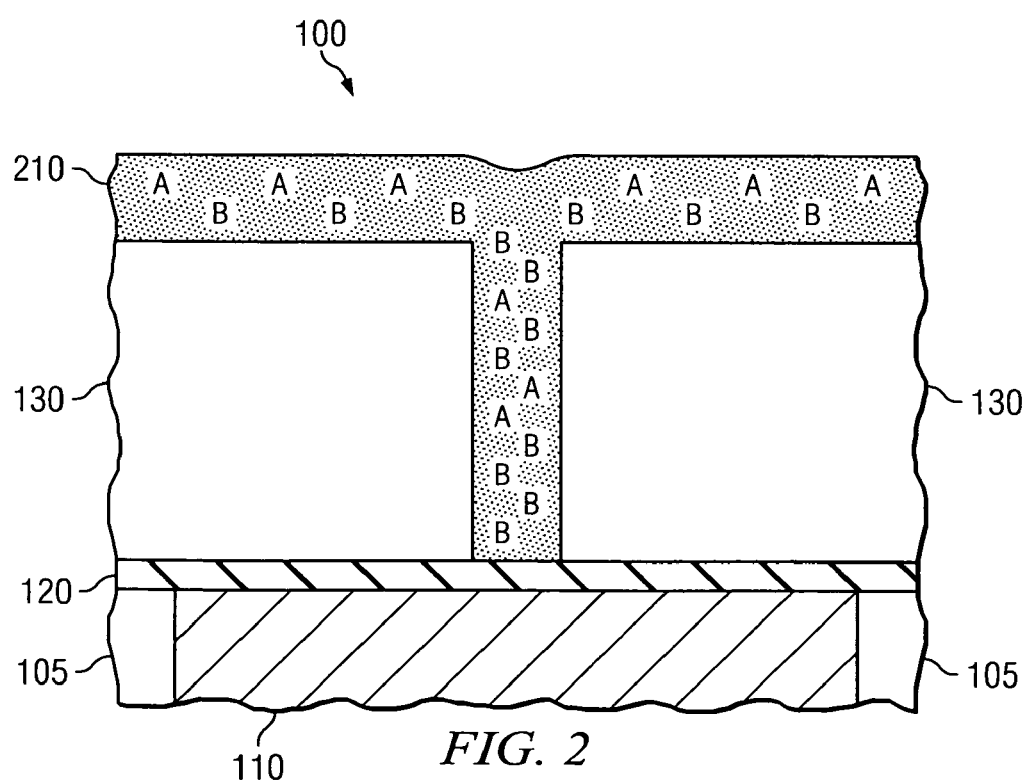
FIG. 2 illustrates a cross-sectional view of the partially completed interconnect structure illustrated in FIG. 1 after removal of the first photoresist layer, e.g., a via photoresist layer, and forming a base getter material within the via.

Turning now to FIG. 2, illustrated is a cross-sectional view of the partially completed interconnect structure 100 illustrated in FIG. 1 after removal of the first photoresist layer 140, and forming a base getter material 210 within the via 160. The first photoresist layer 140 may be removed using a variety of different well-known processes, however, in one exemplary embodiment the first photoresist layer 140 is subjected to a plasma ashing process for removal thereof. In this exemplary embodiment the plasma ashing process uses a hydrogen-containing plasma at a pressure from about 200 to about 1,000 mTorr, preferably about 400 mTorr; a temperature from about 150° C. to about 300° C., preferably about 250° C.; and power (RF) from about 100 to about 1,000 W, preferably about 500 W; for from about 60 seconds to about 300 seconds, preferably about 80 seconds.

As indicated above, after substantially removing the first photoresist layer 140 the base getter material 210 is formed within the via 160. Unique to the present invention, the base getter material 210 may include one or more acids therein. In an exemplary embodiment of the invention the base getter material 210 comprises a material such as P-nitrobenzyltosylate thermal acid generator (TAG), triphenylsulfonium based derivatives, phloroglucinyl, O,O-dinitrobenzyzl sulfonates, benzylsulfonates, and 1,1,1-trihalides. Each of these materials, as previously indicated, may include the acids.

The acids may make their way into the base getter material 210 by way of the addition of an acid generator. As is appreciated by those skilled in the art, acid generators release acids upon being subjected to heat, in the case of thermal acid generators (TAGs), or photons, in the case of photo acid generators (PAGs). For example, temperatures ranging from about 160° C. to about 250° C., and preferably from about 200° C. to about 230° C., are sufficient to cause the TAGs to release the acids. The amount of photons required to cause the PAGs to release the acids is well-known. Thus, the acids may be introduced into the base getter material 210 by way of the acid generators, and activated by way of heat or photons.

Figure 3:
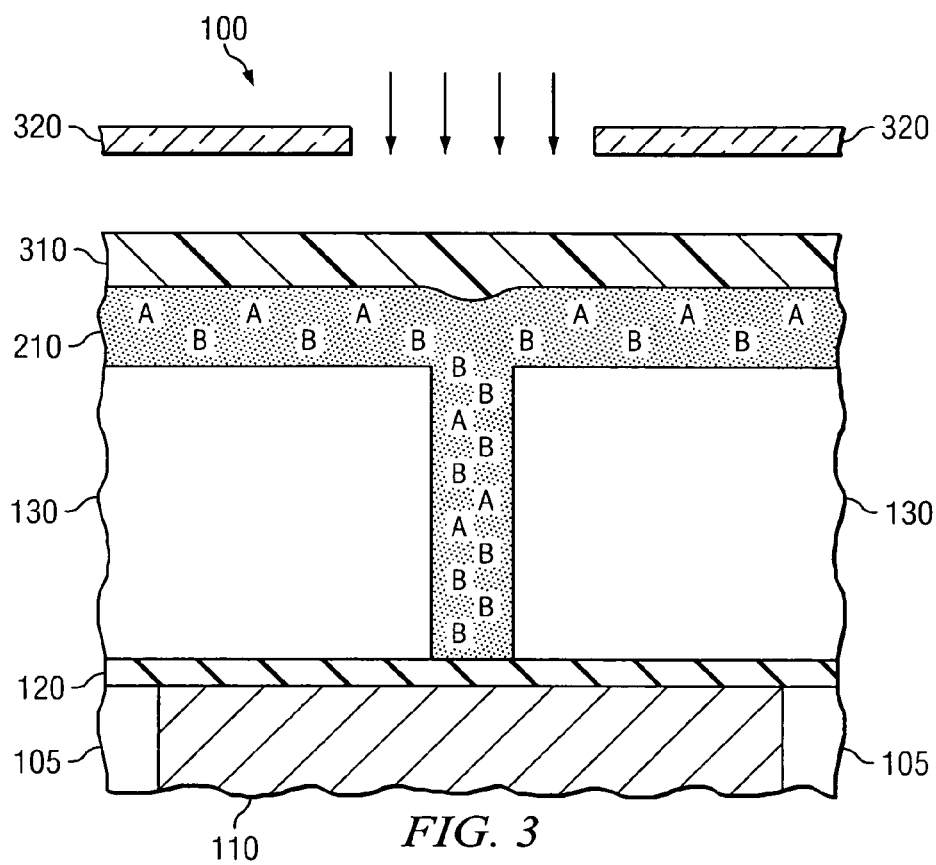
FIG. 3 illustrates a cross-sectional view of the partially completed interconnect structure illustrated in FIG. 2 after forming a second photoresist layer, e.g., a trench photoresist layer, over the base getter material.

While in certain embodiments of the invention the acids are equally distributed throughout the base getter material 210, one advantageous embodiment of the invention has the acids graded such that a higher concentration of the acids are located proximate a base of the via 160 and a lower concentration of the acids are located proximate an interface of the base getter material 210 and the second photoresist layer 310 (FIG. 3). It has been observed that too many acids at the interface between the base getter material 210 and the second photoresist layer 310 (FIG. 3) have the opposite affect as the contaminants on the second photoresist layer 310. To clarify, it has been observed that too many acids at the interface between the base getter material 210 and the second photoresist layer 310 (FIG. 3), in certain instances, causes the patterned second photoresist layer 410 to have an opening wider than desired. It should nonetheless be noted that even though it is believed that the grading of the acids is advantageous, the grading is not required to remain within the bounds of the present invention.

In the instance where the grading is desired, a first acid generator (e.g., A) that distributes itself uniformly inside the base getter material 210, could be used. The first acid generator, in one embodiment comprises P-nitrobenzyltosylate. A second acid generator (e.g., B) that distributes itself near the base of the opening 160 could also be used. The second acid generator, in one embodiment comprises O,O-dinitrobenzyzl sulfonates. Acid generator A could be designed to provide acid, that is after being subjected to heat or photons, to have a weight percent ranging from about 0.5% to about 5%, while the second acid generator B, could have a weight percent ranging from about 1% to about 20%, and preferably from about 5% to about 10%. Acid generator A is typically designed to provide a uniform acid concentration across the getter material 210 for cross-linking, once heated. Acid generator B is typically designed to provide a graded acid concentration across the getter material 210, with a higher concentration inside the via 160.

The base getter material 210 may be formed within the via 160 using a number of different processes. In one exemplary embodiment, however, the base getter material 210 is formed using a conventional spin-on process. Other well known processes could nonetheless be used.

Turning now to FIG. 3, illustrated is a cross-sectional view of the partially completed interconnect structure 100 illustrated in FIG. 2 after forming a second photoresist layer 310 over the base getter material 210. In certain embodiments where the second photoresist layer 310 performs as a anti-reflective coating layer, it may be formed directly on the base getter material 210. The second photoresist layer 310 may again comprise any known or hereafter discovered photoresist material while staying within the scope of the present invention. The second photoresist layer 310 may be conventionally formed having a variety of different thicknesses. One embodiment of the invention, however, has the second photoresist layer 310 having a thickness ranging from about 160 nm to about 350 nm.

While FIG. 3 illustrates that the second photoresist layer 310 is deposited directly on the base getter material 210, certain embodiments exist where the base getter material 210 is etched prior to the formation of the second photoresist layer 310. For example, the base getter material 210 may be dry etched or wet recessed to a desired thickness prior to the formation of the second photoresist layer 310. Again, this represents but one embodiment of the present invention.

Additionally a bottom anti-reflective coating layer (BARC), which is not shown, may advantageously be formed between the base getter material 210 and the second photoresist layer 310. This embodiment might benefit the device in providing better critical dimension (CD) control, better resist profile control, etc. Note, again, this represents but another embodiment of the present invention.

It should be noted that the base getter material 210 and the second photoresist layer 310 may combine to form a bilayer photoresist. In this instance, the base getter material 210 would form the underlayer of the bilayer photoresist and the second photoresist layer 310 would form the imaging layer of the bilayer photoresist. As those skilled in the art understand the mechanism by which the bilayer photoresist scheme works, no further detail will be given. Nonetheless, while the bilayer photoresist scheme is disclosed it represents only one embodiment of the present invention.

Positioned over the second photoresist layer 310 in the embodiment of FIG. 3 is a conventional reticle 320. The reticle 320 is configured to transfer a predetermined pattern to the second photoresist layer 310. In the embodiment of FIG. 3, the reticle 320 has an opening therein configured to allow photons from an energy source to expose portions of the second photoresist layer 310.

Figure 4:
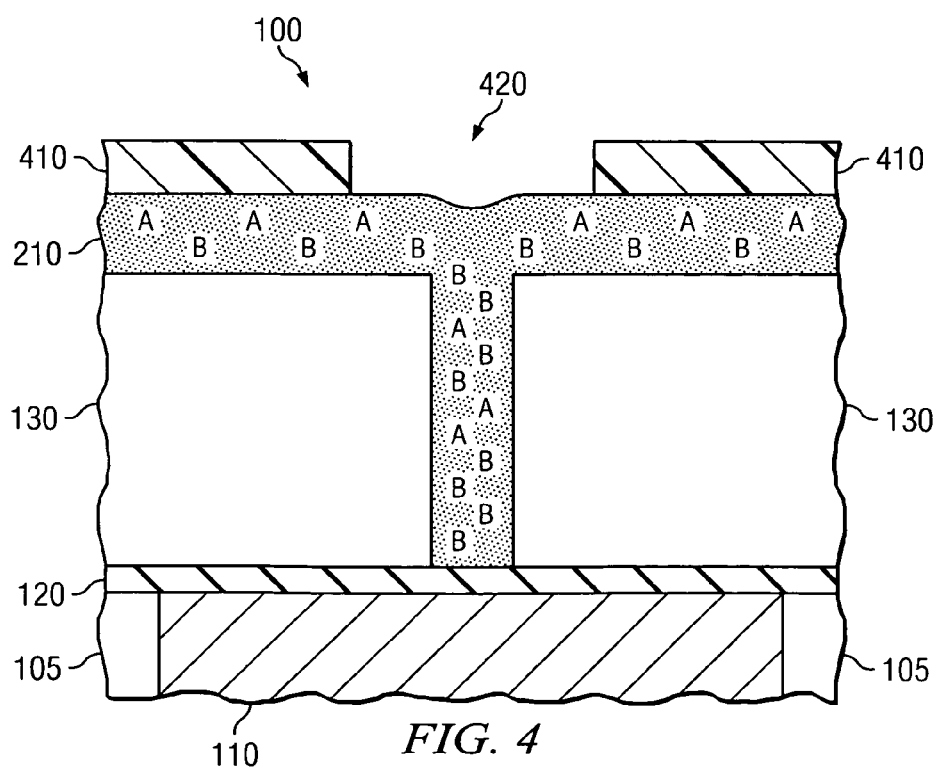
FIG. 4 illustrates a cross-sectional view of the partially completed interconnect structure illustrated in FIG. 3 after exposing the second photoresist layer to an energy source and washing away developed portions of the second photoresist layer, resulting in a patterned second photoresist layer.

Turning now to FIG. 4, illustrated is a cross-sectional view of the partially completed interconnect structure illustrated in FIG. 3 after exposing the second photoresist layer 310 to an energy source and washing away developed portions of the second photoresist layer 310, resulting in a patterned second photoresist layer 410. As is illustrated in FIG. 4, the second photoresist layer 310 is patterned, as by conventional techniques not described herein for brevity, to include at least one opening 420 therein in vertical registry with the via 160. The opening 420 has a relatively wide width corresponding to the width of a trench 510 (FIG. 5) opening to be next formed in the second substrate 130. The width of the opening 420 is typically from about 90 nm to about 400 nm, and preferably about 120 nm wide. Again, other widths are within the scope of the present invention.

In the particular embodiment of FIG. 4 the second photoresist layer 310 was a positive photoresist layer. That is, exposed portions of the second photoresist layer 310 subjected to the energy source are the portions that are developed, and therefore are the ones that are removed. Those skilled in the pertinent art are aware that a negative photoresist layer could have just as easily been used.

Notice how the resulting sidewalls of the patterned photoresist layer 410 are substantially vertical. Notice also how the opening in the patterned photoresist layer 410 is substantially similar in size and location to the opening in the reticle 320. Among other things, this goes to show that the base getter material 210 substantially reduced any issues associated with the contaminants located within the various layers of the interconnect structure 100.

Figure 5:
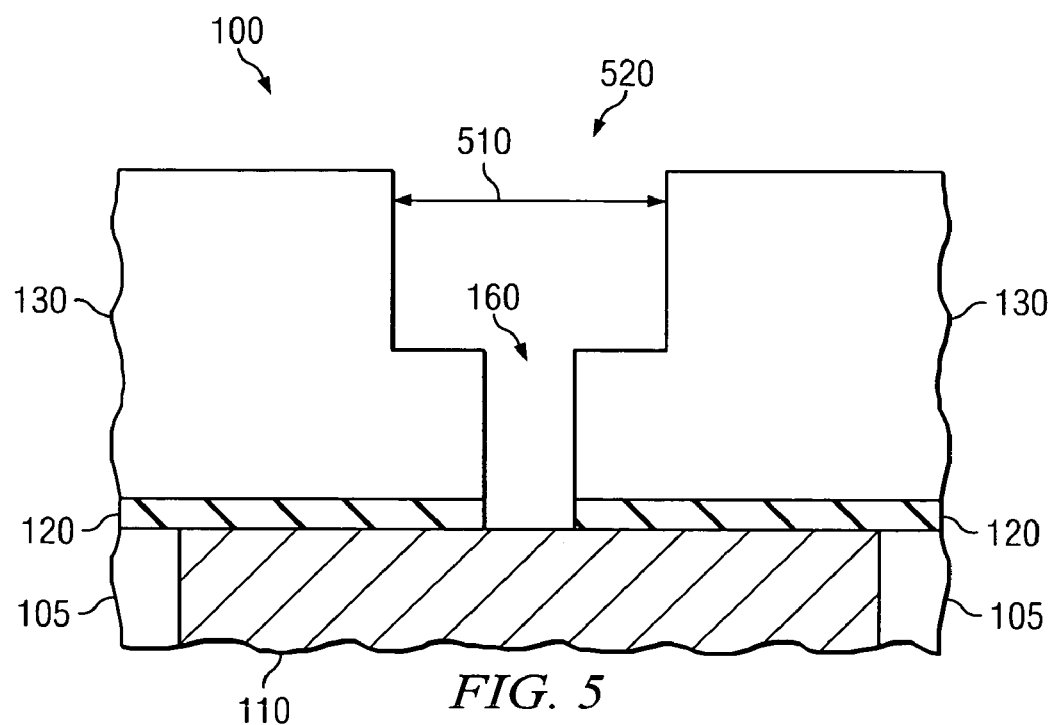
FIG. 5 illustrates a cross-sectional view of the partially completed interconnect structure illustrated in FIG. 4 after using the patterned second photoresist layer to etch a trench into the second substrate.

Turning now to FIG. 5, illustrated is a cross-sectional view of the partially completed interconnect structure 100 illustrated in FIG. 4 after using the patterned second photoresist layer 410 to etch a trench 510 into the second substrate 130. Those skilled in the art understand the process for using a patterned photoresist layer to etch the trench 510 in the second substrate 130. In one exemplary embodiment a reactive plasma etching process using $C_4F_8/O_2/Ar$ is used to etch into the second substrate 130 to form the trench 510.

In certain instances, a portion of the base getter material 210 may remain within the via 160 portion. In those instances the remaining base getter material 210 would need to be removed. For instance, an oxygen ash followed by a conventional wet clean process could be used to remove this remaining base getter material 210.

It should further be noted that certain embodiments of the invention require an additional via stop layer etch to remove the exposed portion of the via stop layer 120 from the via opening 160. Many conventional etches could be used to remove this portion, including a standard reactive ion etch (RIE) process.

What results, at least after removing the second photoresist layer 410, is a dual damascene opening 520 having a relatively narrow via opening 160 communicating with a relatively wide trench opening 510. Those skilled in the art understand the process that might be used to remove the second photoresist layer 410. For example, a plasma ashing techniques similar to that used for removal of the first photoresist layer 140 could be used.

Figure 6:
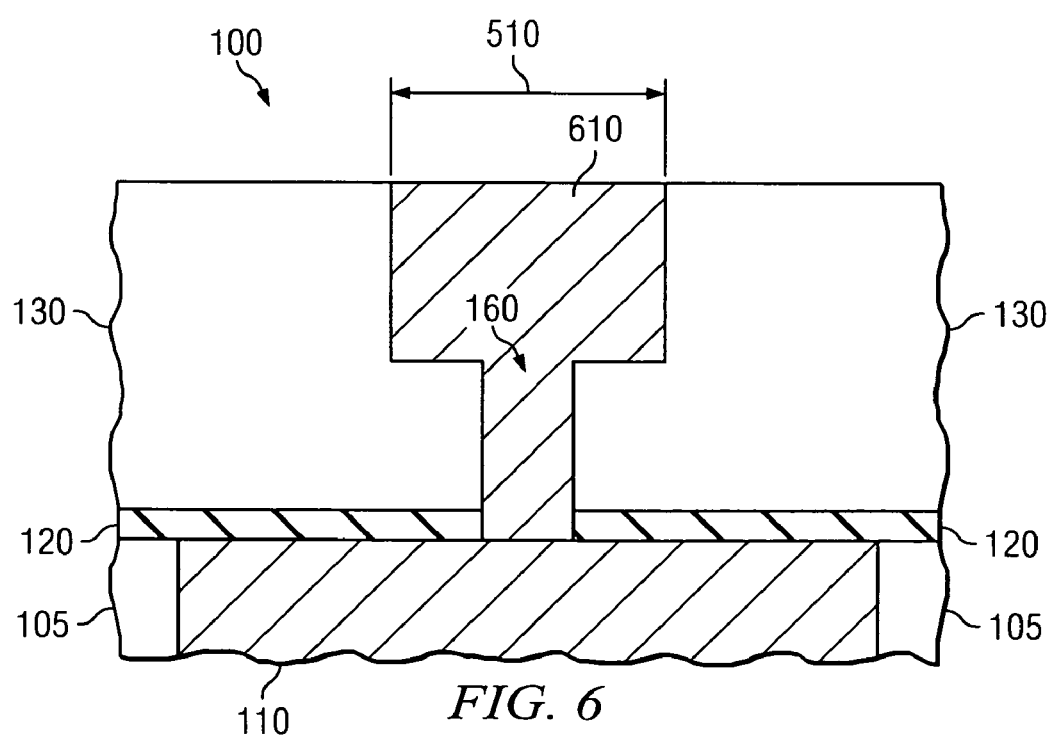
FIG. 6 illustrates a cross-sectional view of the partially completed interconnect structure illustrated in FIG. 5 after filling the dual-damascene opening with a conductive material and chemical mechanical polishing the structure.

Next, as shown in FIG. 6, the dual-damascene opening 520 may then be filled with an electrically conductive material, e.g., a metal material, typically of Cu or a Cu-based alloy by means of electroplating. Accordingly, consistent with conventional practices for performing Cu-based metallization processing, a barrier layer, such as of tantalum (Ta) or tantalum nitride (TaN), may be initially deposited to line the dual-damascene opening 520. A seed layer, such as of a Cu alloy containing at least one of magnesium (Mg), aluminum (Al), zinc (Zn), zirconium (Zr), tin (Sn), nickel (Ni), palladium (Pd), silver (Ag), gold (Au) or another suitable material may then be deposited to line the recess walls of the dual-damascene opening 520. A plug 610 of Cu or a Cu-based alloy may then be deposited, as by the aforementioned electroplating or electroless plating, to fill the dual-damascene opening 520 and form a blanket layer therein. Planarization processing (not shown) of the thus-obtained structure, as by chemical-mechanical polishing ("CMP"), may then be performed to remove the excess blanket layer and make the upper surface of the plug 610 substantially co-planar with the upper surface of the second substrate 130. The resulting dual-damascene opening 520 filled with the metal plug 610 comprises a completed interconnect structure, which has been manufactured in accordance with the principles of the present invention.

While the exact mechanism for the observed elimination or substantial reduction in photoresist poisoning provided by the instant methodology is not known with certainty, and not desirous of being bound by any particular mechanism or theory, it is nonetheless believed that the base getter material 210 substantially reduces the amount of basic material provided by the ammonia or other nitrogen containing species on the upper surface of the lower metal feature 110 from contacting the second photoresist layer 310 during patterning thereof. As a consequence, photoresist patterning by selective removal of portions thereof can be accomplished without the degradation of pattern replication and dimensional accuracy, as expected in the prior art.

As a consequence of the above-described inventive methodology, high-quality, low resistance, accurately dimensioned electrical contacts, interconnections, and metallization patterns for use in high integration density semiconductor devices may be advantageously formed in a rapid, cost-effective manner utilizing conventional manufacturing techniques, apparatus, and instrumentalities. In addition, the inventive methodology enjoys utility in the manufacture of various other electrical and electronic devices and components wherein photoresist and dielectric layers are patterned and/or removed, as by plasma etching/ashing techniques. Finally, the invention can be practiced at rates consistent with the throughput requirements of automated manufacturing processes and is fully compatible with conventional process flow for the manufacture of semiconductor IC devices and components.

In the previous description, numerous specific details are set forth, such as specific materials, structures, reactants, processes, parameters, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible to changes or modifications within the scope of the inventive concept as expressed herein.

Figure 7:
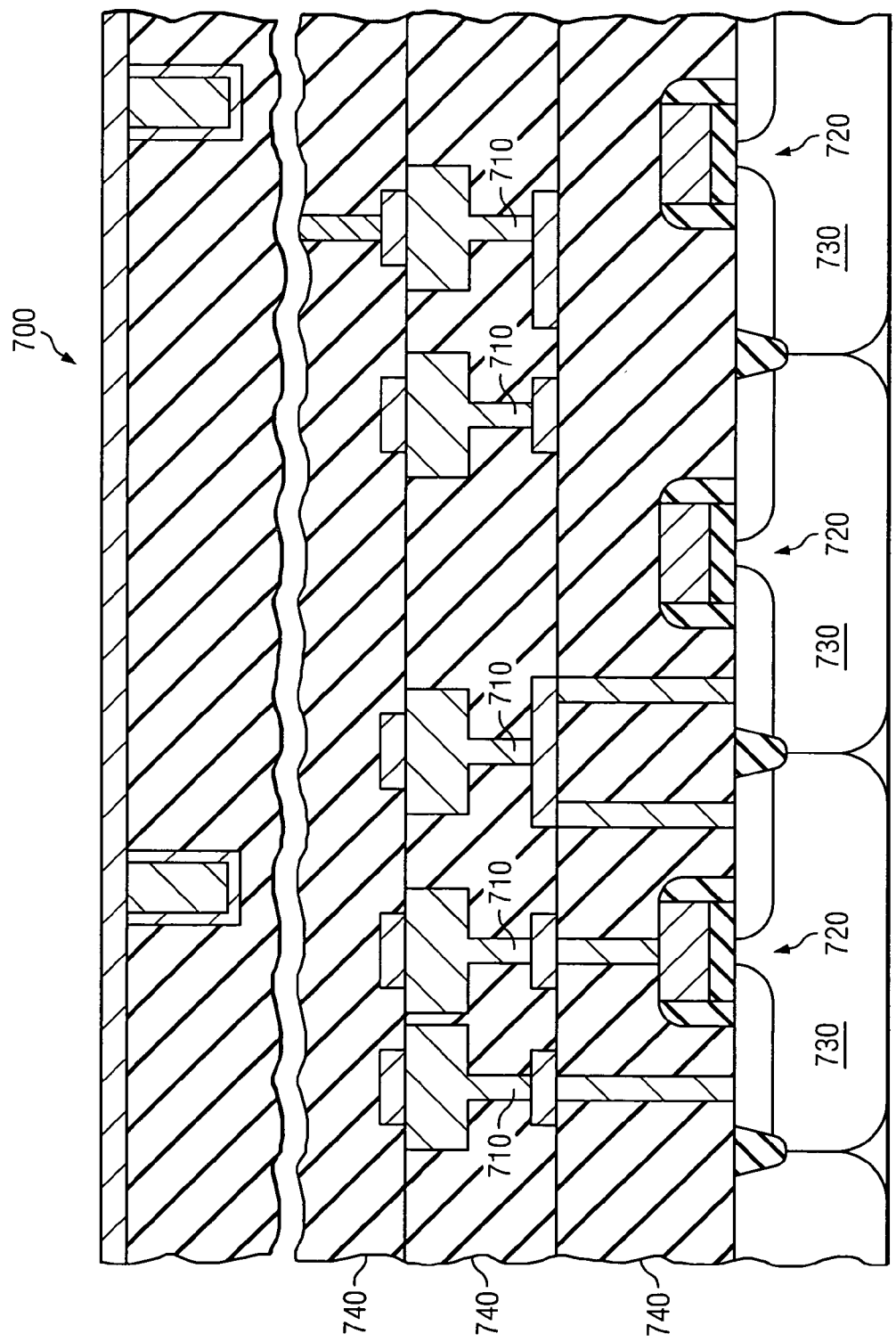
FIG. 7 illustrates an exemplary cross-sectional view of an integrated circuit (IC) incorporating interconnect structures constructed according to the principles of the present invention.

Referring finally to FIG. 7, illustrated is an exemplary cross-sectional view of an integrated circuit (IC) 700 incorporating interconnect structures 710 constructed according to the principles of the present invention. The IC 700 may include devices, such as transistors used to form CMOS devices, BiCMOS devices, Bipolar devices, as well as capacitors or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes transistor devices 720 located over a semiconductor substrate 730. As is illustrated in FIG. 7, dielectric layers 740 are located over the transistor devices 720, the interconnect structures 710 being located within the dielectric layers 740, thus, forming the operational integrated circuit 700.

Although the present invention has been described in detail, one of ordinary skill in the art should understand that they can make various changes, substitutions and alterations herein without departing from the scope of the invention.

What is claimed is:

1. A method of manufacturing an interconnect, comprising:
   forming a via in a substrate;
   forming a base getter material in the via, the base getter material including acids;
   forming a photoresist layer over the base getter material, the photoresist layer having an opening therein positioned over the via, and further wherein the acids are graded such that a higher concentration of acids are located proximate a base of the via and a lower concentration of acids are located proximate an interface of the base getter material and the photoresist layer; and
   etching a trench into the substrate using the opening in the photoresist layer.

2. The method as recited in claim 1 wherein the acids include a first acid generator and a second acid generator, the first acid generator having a weight percent ranging from about 0.5% to about 5% and the second acid generator having a weight percent ranging from about 1% to about 20%.

3. The method as recited in claim 1 wherein forming a base getter material includes forming a base getter material comprising a material selected from the group consisting of P-nitrobenzyltosylate, triphenylsulfonium based derivatives, phloroglucinyl, O,O-dinitrobenyzyl sulfonates, benzylsulfonates, and 1,1,1-trihalides.

4. The method as recited in claim 1 further including a copper metal feature located under the substrate, the copper metal feature exposed to ammonia prior to forming the substrate.

5. The method as recited in claim 4 wherein the base getter material getters at least a portion of the ammonia from the top surface of the copper metal feature.

6. The method as recited in claim 1 wherein forming a base getter material includes forming a base getter material including a first acid generator and a second different acid generator.

7. The method as recited in claim 6 wherein the first acid generator comprises P-nitrobenzyltosylate and the second different acid generator comprises O,O-dinitrobenyzyl sulfonates.

8. The method as recited in claim 1 wherein the interconnect comprises a dual damascene interconnect.

* * * * *